United States Patent [19]
Wu

[11] Patent Number: 5,963,799
[45] Date of Patent: Oct. 5, 1999

[54] BLANKET WELL COUNTER DOPING PROCESS FOR HIGH SPEED/LOW POWER MOSFETS

[75] Inventor: Shye-Lin Wu, Hsinchu, Taiwan

[73] Assignee: Texas Instruments - Acer Incorporated, Hsinchu, Taiwan

[21] Appl. No.: 09/046,332

[22] Filed: Mar. 23, 1998

[51] Int. Cl.$^6$ .................. H01L 21/8238; H01L 21/425
[52] U.S. Cl. ................... 438/199; 438/225; 438/514; 438/527
[58] Field of Search .................. 438/199, 225, 438/227, 228, 289, 297, 514, 527

[56] References Cited

U.S. PATENT DOCUMENTS

| | | | |
|---|---|---|---|
| 5,141,882 | 8/1992 | Komori et al. | 437/34 |
| 5,283,200 | 2/1994 | Okamoto | 437/29 |
| 5,290,714 | 3/1994 | Onozawa | 437/27 |
| 5,399,895 | 3/1995 | Koga | 257/372 |
| 5,464,789 | 11/1995 | Saito | 437/57 |
| 5,516,711 | 5/1996 | Wang | 437/34 |
| 5,693,505 | 12/1997 | Kobayashi | 437/154 |
| 5,795,801 | 8/1998 | Lee | 438/199 |
| 5,795,803 | 8/1998 | Takamura et al. | 438/228 |
| 5,804,846 | 9/1998 | Fuller | 257/252 |

OTHER PUBLICATIONS

K.F. Lee et al., Room Temperature 0.1 $\mu$m CMOS Technology with 11.8 ps Gate Delay, 1993 IEEE, pp. 131–134, no month given.

Ramune Nagisetty et al., A Novel Self–Aligned Punch-through Implant: A Simulation Study, IEEE Transactions on Electron Devices, vol. 43, No. 8, Aug. 1996, pp. 1312–1314.

Hiroyuki Nakamura et al., A Self–Aligned Counter–Doped Well Process Utilizing Channeling Ion Implantation, IEEE Transactions on Electron Devices, vol. 43, No. 7, Jul. 1996, pp. 1099–1103.

*Primary Examiner*—Jey Tsai
*Assistant Examiner*—Christopher Lattin
*Attorney, Agent, or Firm*—Harness, Dickey & Pierce, P.L.C.

[57] ABSTRACT

The present invention is a blanket well counter doping process for high speed and low power MOSFETs. An N-well region and a P-well region are in a substrate and a pad silicon oxide layer is on the substrate. A silicon nitride pattern is formed on the pad oxide layer to define active regions of the N-well and P-well region, a field oxide region is formed by using the silicon nitride as a mask. Afterward, an N-type ion implantation is implemented for anti-punchthrough region of the N-well region. A blanket P-type ion implantation is performed for N-well counter doping and P-well doping. A P-type low-energy and low-dosage ions is then implanted into the substrate for the threshold voltage adjustment. The last implantation stage is N-type and low dose to form a P-well counter doping region and an N-well doping region. Finally, a gate structure is manufactured on the N-well region and the P-well region and source/drain regions are fabricated in the P-well region and the N-well region to form an NMOS device and a PMOS device.

17 Claims, 7 Drawing Sheets

BLANKET WELL COUNTER DOPING PROCESS FOR HIGH SPEED/LOW POWER MOSFETS

FIELD OF THE INVENTION

The present invention relates to a method of manufacturing high speed/low power MOSFETs, and more specifically, to a method of manufacturing high speed/low power MOSFETs with blanket well counter doping region in the channel region of the device.

BACKGROUND OF THE INVENTION

With the advancement of the circuit's design, a high speed and low power circuit application is particularly needed and the dimension of metal oxide semiconductor devices has to be scaled down to sub-0.1 micron meters. Shrinking the dimension of the device could produce some problems, such as a punchthrough issue and a short channel effect, which limit the shrinkage of the size of device. In IEDM Tech. Dig. page 131 on 1993, K. F. Lee et al. tried some approaches to design a complementary metal oxide semiconductor (CMOS) on bulk silicon substrate with 11.8 picoseconds gate delay. The authors of this paper summarized some design outline for improving device's operating speed. The design outlines comprise a vertical-doping-engineered transistor structures, high energy well implants for reducing junction capacitance, lateral local doping structures in the channel region of devices, two-step sidewalls and salicidation of a device's gate. By using the design outlines, the authors of the paper fabricated a CMOS structure with a shorter gate delay at room temperature than a conventional CMOS device.

To solve the punchthrough problem, the substrate doping level must be increased, which will cause a higher parasitic source-drain junction capacitance and a lower junction breakdown voltage. High energy self-aligned punchthrough implant or low energy ion channeling implant to form self-aligned counter-doped wells could be used to reduce the junction capacitance for high speed ULSI devices.

In the 0.1 micron meters regime, masking the punch-through implant from the source-drain region and using lateral punchthrough implants are used to reduce the parasitic source-drain capacitance. A simulation study for a novel self-aligned punchthrough implant is published in IEEE Trans. Electron Devices, on page 1312 of vol. ED-43 on 1996, entitled "A Novel Self-Aligned Punchthrough Implant: A Simulation Study". The paper presents a simulation study of a novel self-aligned punchthrough implant. In this paper, a process for a novel and simple self-aligned punchthrough implant is presented. The self-aligned dopant profile is achieved using a high-energy implant after polysilicon gate definition. This simple process is accomplished through the utilization of very high-energy implants between 260 to 650 KeV. By implanting through the defined polysilicon gate using very high energy, a vertically engineered doping profile is achieved. In the channel region, the resulting implant peak is close to the surface while under the source-drain regions the implant peak is well below the junctions. The parasitic junction capacitance is less than that of a conventionally engineered device. Thus, performance of devices is increased through the reduction of parasitic junction capacitance. In this analysis an established 0.5 micrometers baseline technology shows a 10% reduction in the delay of a loaded inverter. Technologies with smaller or larger gate dimensions can be applied so well.

Local channel doping technology is another possibility for the reduction of parasitic capacitance. This process implants only on channel region of MOSFETs for the threshold voltage control and it suppresses any increase in well concentration under the source/drain region. A self-aligned counter-doped well process is published in IEEE Trans. Electron Devices, at page 1099 of vol. ED-43 on 1996. The title of this paper is "A Self-Aligned Counter-Doped Well Process Utilizing Channeling Ion Implantation". The authors of the paper described a new self-aligned counter-doped well process for low junction capacitance CMOS's. FIG. 1 according to the paper showed a concentration profile after channeling ion implantation and a lower net concentration in a well was resulted by counter well-doping technology. A process flow for manufacturing transistor devices was shown in FIG. 6. The self-aligned counter well doping was performed after the formation of gate and spacer. The conclusion of the paper was that a 50%–70% reduction in junction capacitance has been achieved by utilizing self-aligned counter doping of well with channeling ion implantation.

According to the above discussions, the prior art for reducing the source-drain parasitic capacitance is to perform a channel implantation after the formation of gate material. However, these two methods will cause a gate oxide reliability issue and need additional masks.

SUMMARY OF THE INVENTION

A method for manufacturing a high speed and low power MOSFETs is disclosed in the present invention. Firstly, a substrate is provided with a P-well region and an N-well region. A pad oxide layer is covered on the substrate. A silicon nitride pattern is formed on the pad oxide layer to define the active regions of devices. Afterward, a field oxide region is formed on the substrate for the isolation between the N-well region and the P-well region. The silicon nitride pattern is removed by using conventional etching method.

An N-type ion implantation is performed on the N-well region to form an anti-punchthrough region, using Arsenic ion or Phosphorus ion as dopants. A blanket P-type ion implantation is performed on the substrate for N-well counter doping and P-well doping, which is indicated as field oxide isolation (FISO) implant. The dopant of the blanket implantation is boron ion. After the blanket implantation, a low-energy and low-dosage P-type implantation is implemented for the threshold voltage adjustment. The last ion implantation is a low-dosage N-type ion implantation to form a P-well counter doping region and an N-well doping region.

Finally, a gate structure is fabricated on the N-well region, the P-well region, and the source/drain regions of PMOS and NMOS are manufactured in the N-well region and the P-well region, respectively.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
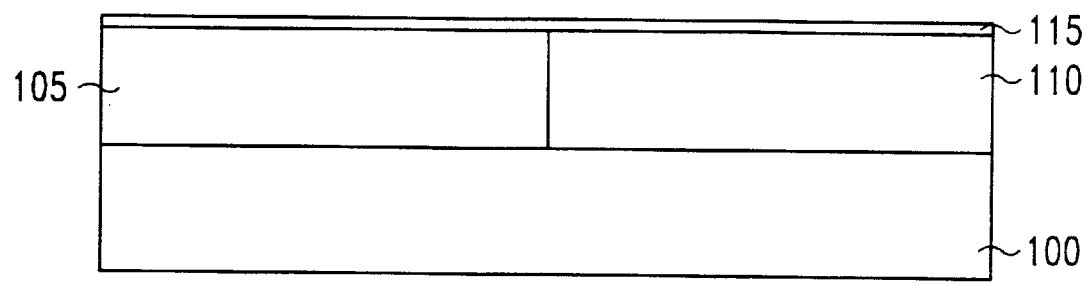
FIG. 1 shows a cross sectional view of a semiconductor substrate with an N type doped well and a P type doped well and a pad oxide on the surface of the substrate in accordance with the present invention.

Referring to FIG. 1, a single crystal substrate 100 with a <100> crystallographic orientation is used for the preferred embodiment. An N-well region 105 and a P-well region 110 are formed in the substrate 100 by conventional manner. A P channel metal oxide semiconductor (PMOS) and an N channel metal oxide semiconductor (NMOS) will be fabricated later on the twin well of the substrate 100. A thin pad oxide film 115 is formed atop the substrate 100 by using thermal oxidation technique and has a thickness between about 50 to 250 angstroms. Alternatively, the pad oxide 115 can be formed by using conventional chemical vapor deposition (CVD).

Figure 2:
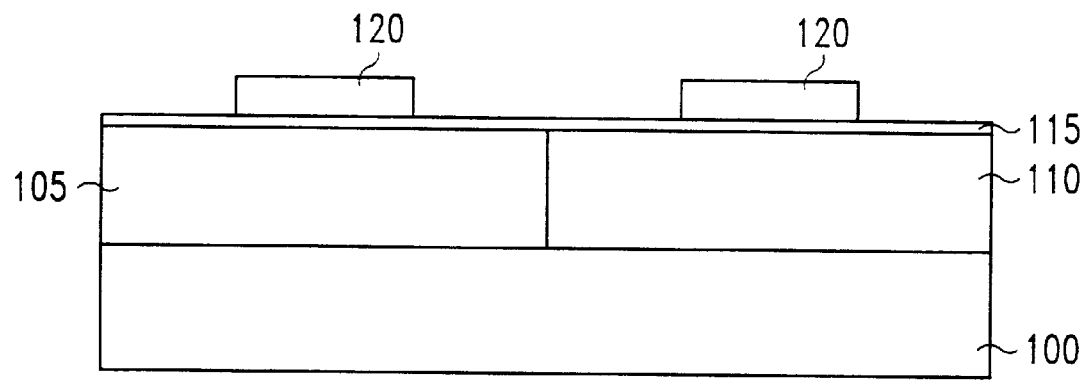
FIG. 2 shows the formation of a thick silicon nitride pattern for defining the active region of devices in accordance with the present invention.

Turning to FIG. 2, a thick silicon nitride layer 120 is patterned on the pad oxide 115 to define active regions of the substrate 100. In a case, the silicon nitride layer 120 is deposited by using conventional chemical vapor deposition, using $SiH_2Cl_2$ and $NH_3$ as source, having a thickness between about 1000 to 2000 angstroms.

Figure 3:
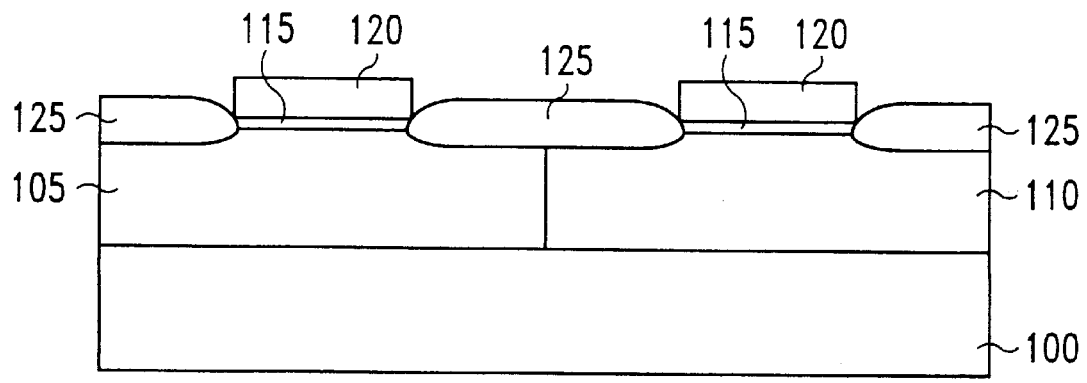
FIG. 3 shows the formation of field oxide regions to isolate the active region of devices in accordance with the present invention.

As is shown in FIG. 3, a thick field oxide region (FOX) 125, is created using conventional methods for the purposes of isolation. A thermal oxidation in an oxygen-steam ambient is used to form the FOX 125 region, to a thickness of about 3000 to 8000 angstroms.

Figure 4:
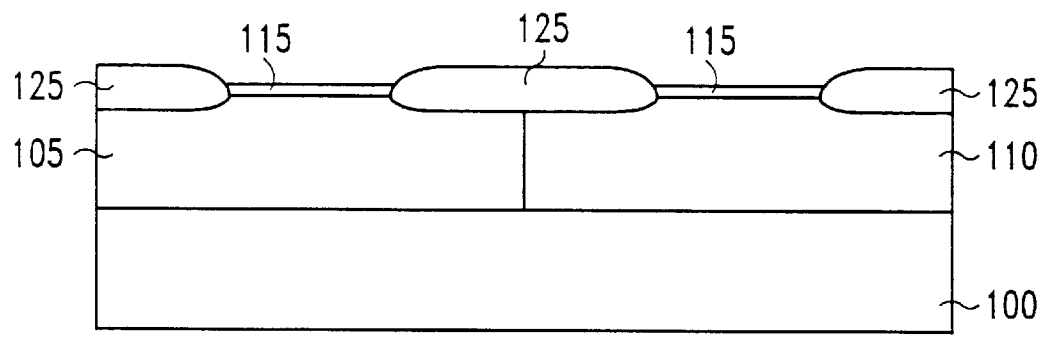
FIG. 4 shows the removing of the silicon nitride pattern in accordance with the present invention.

Turning to FIG. 4, the silicon nitride film 120 on the pad oxide layer 115 is removed by using hot $H_3PO_4$ solution. A PMOS and a NMOS will be subsequently fabricated on the well regions between field oxide regions 125.

Figure 5:
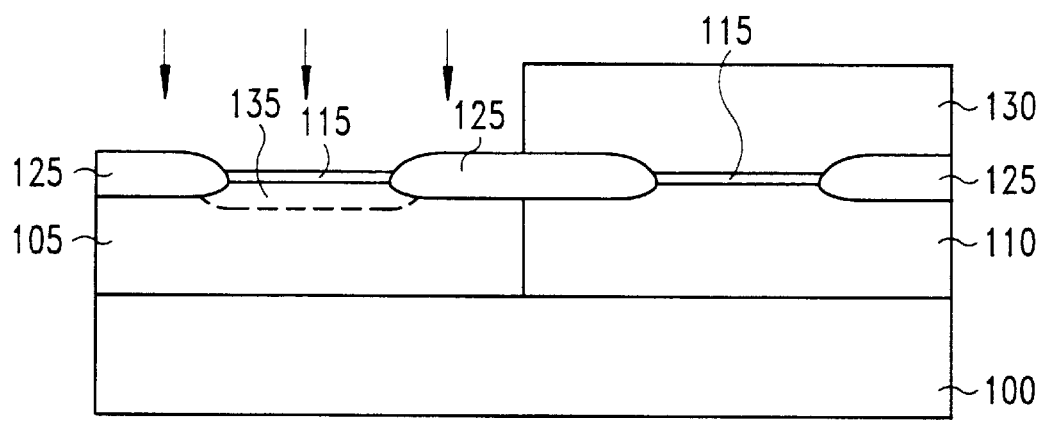
FIG. 5 shows the formation of an anti-punchthrough region in the substrate in accordance with the present invention.

Referring to FIG. 5, an ion implantation having N-type dopants are used to implant ions into the N-well region 105, thereby forming an anti-punchthrough region 135 of the N-well region 105. In the step, the P-well region 110 is covered by a photoresist layer 130 as a mask. The N-type dopants include Arsenic ion or Phosphorus ion. In a case, the anti-punchthrough implantation has an implanting energy between about 80 to 200 KeV and a dosage between about $1\times10^{12}$ to $2\times10^{13}$ ions/cm$^2$. The N-type anti-punchthrough region 135 is used to reduce the doping concentration gradient in the N-well region 105 to prevent the punch-through effect between the N-well region 105 and the P-well region 110. After the anti-punchthrough implantation, the photoresist layer 130 is removed by using conventional technique.

Figure 6:
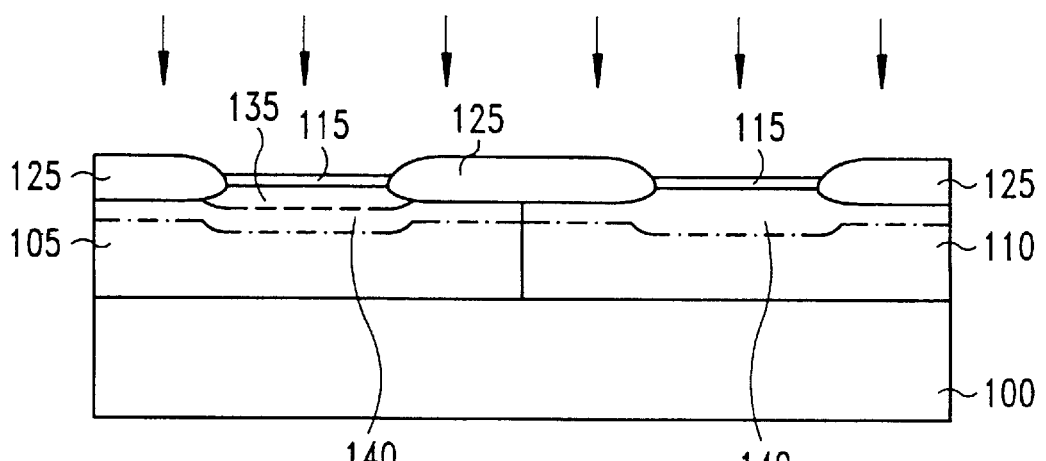
FIG. 6 shows the formation of a counter doping region in the N-well and a doping region in the P-well in accordance with the present invention.

As is illustrated in FIG. 6, a blanket ion implantation with boron ions is implemented for N-well region 105 counter doping, P-well region 110 doping and the threshold voltage adjustment of the field oxide device. The boron ion implantation is a high energy and low dosage implantation, at an energy between about 100 to 250 KeV, using a dosage between about $5\times10^{11}$ to $5\times10^{12}$ ions/cm$^2$. The blanket ion implantation is indicated as a field oxide isolation implant. As stated above, a P-type counter doped region 140 is formed in the N-well region 105 so as to reduce the N-type doped concentration in the N-well region 105. In the same stage, a P-type doped region 140 is simultaneously formed in the P-well region 110.

Figure 7:
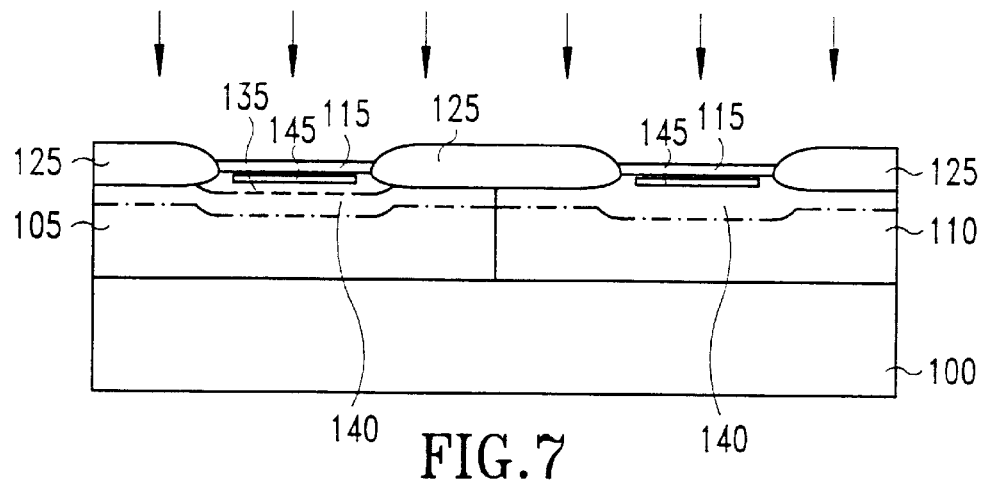
FIG. 7 shows the formation of P-type regions in the N-well and the P-well in accordance with the present invention.

As is shown in FIG. 7, $BF_2$ ions are implanted into the N-well region 105 and the P-well region 110 to adjust the N-channel and P-channel threshold voltage. The $BF_2$ ion implantation is performed with low energy and low dosage, a P-type doped region 145 is formed in the N-well region 105 and the P-type region 110. In a case, the $BF_2$ ion implantation has an energy between about 30 to 120 KeV and a dosage between about $2\times10^{12}$ to $4\times10^{13}$ ions/cm$^2$.

Figure 8:
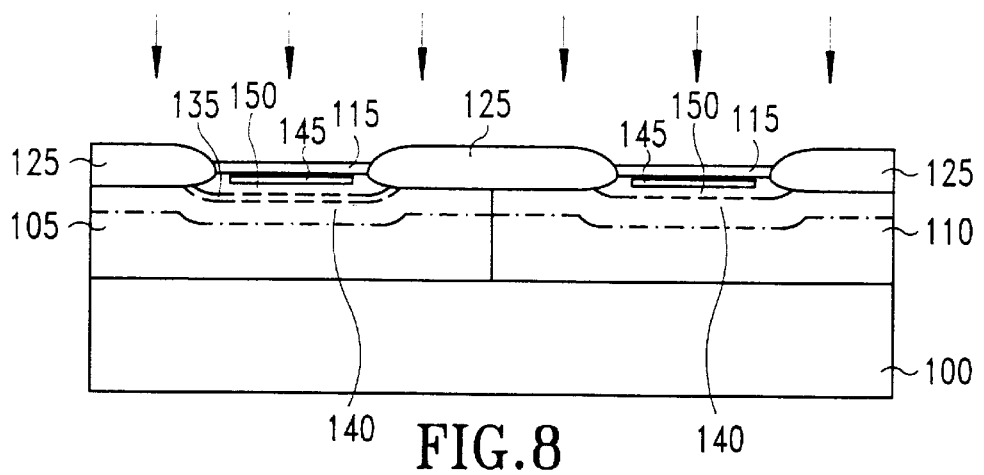
FIG. 8 shows the formation of N-type region in the N-well and the P-well in accordance with the present invention.

Referring to FIG. 8, a P-type ion implantation is performed for P-well region 110 counter doping and an N-well region 105 doping and an N-type doping region 150 is formed in the N-well region 105 and P-well region 110. The ion implantation uses Phosphorus ions as dopant with high energy and low dosage. The energy of the ion implantation is between about 80 to 250 KeV and the dosage of the ion implantation is between about $4\times10^{11}$ to $4\times10^{12}$ ions/cm$^2$. The N-type doping region 150 in the P-well region 110 is a counter doping for lowering the dopant concentration of the P-well region.

Figure 9:
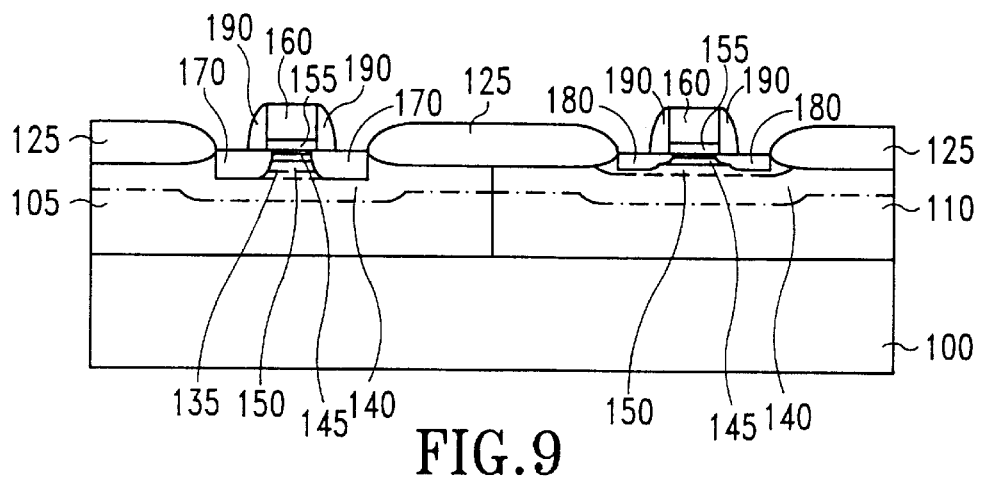
FIG. 9 shows the formation of PMOSFET and NMOSFET on the substrate in accordance with the present invention.

Turning to FIG. 9, the pad oxide layer 115 is removed using buffer oxide etching (BOE) solution or other etching technique. Afterward, a gate oxide layer 155 and a gate 160 are deposited onto the N-well region 105 and the P-well region 110 to form a P channel metal oxide semiconductor field oxide transistor (PMOSFET) and a N channel metal oxide semiconductor field oxide transistor (NMOSFET), respectively. The source/drain 170 of the PMOSFET and the source/drain 180 of the NMOSFET are formed by using conventional technique. Silicon oxide spacers 190 are then fabricated on the sidewalls of the gate structure 160 and the gate oxide layer 155 for isolation.

In the present invention, a PMOSFET and an NMOSFET are fabricated on a substrate. There are four ion implantation stages for the manufacturing of the devices. The first implantation is to implant N-type ions into the N-well region for an anti-punchthrough region of PMOS. The second implantation is to implant P-type ions into the N-well region and the P-well region to form the counter-doping region of PMOS and the doping region of NMOS. The third implantation is referred to the field oxide isolation (FISO) implantation. The third implantation is to implant P-type ions into the substrate for the threshold voltage adjustment of the NMOS and PMOS. The fourth implantation is an N-type implantation to form the counter-doping region of NMOS and the doping region of PMOS. As be described above, PMOS needs four implantation stages and NMOS needs three implantation stages. The threshold voltage and the doping profiles of NMOS and PMOS are determined by changing the conditions of the implanting stages. In detail, the characteristic of the devices in accordance with the present invention is different to the characteristic of the devices in accordance with the prior art.

Figure 10:
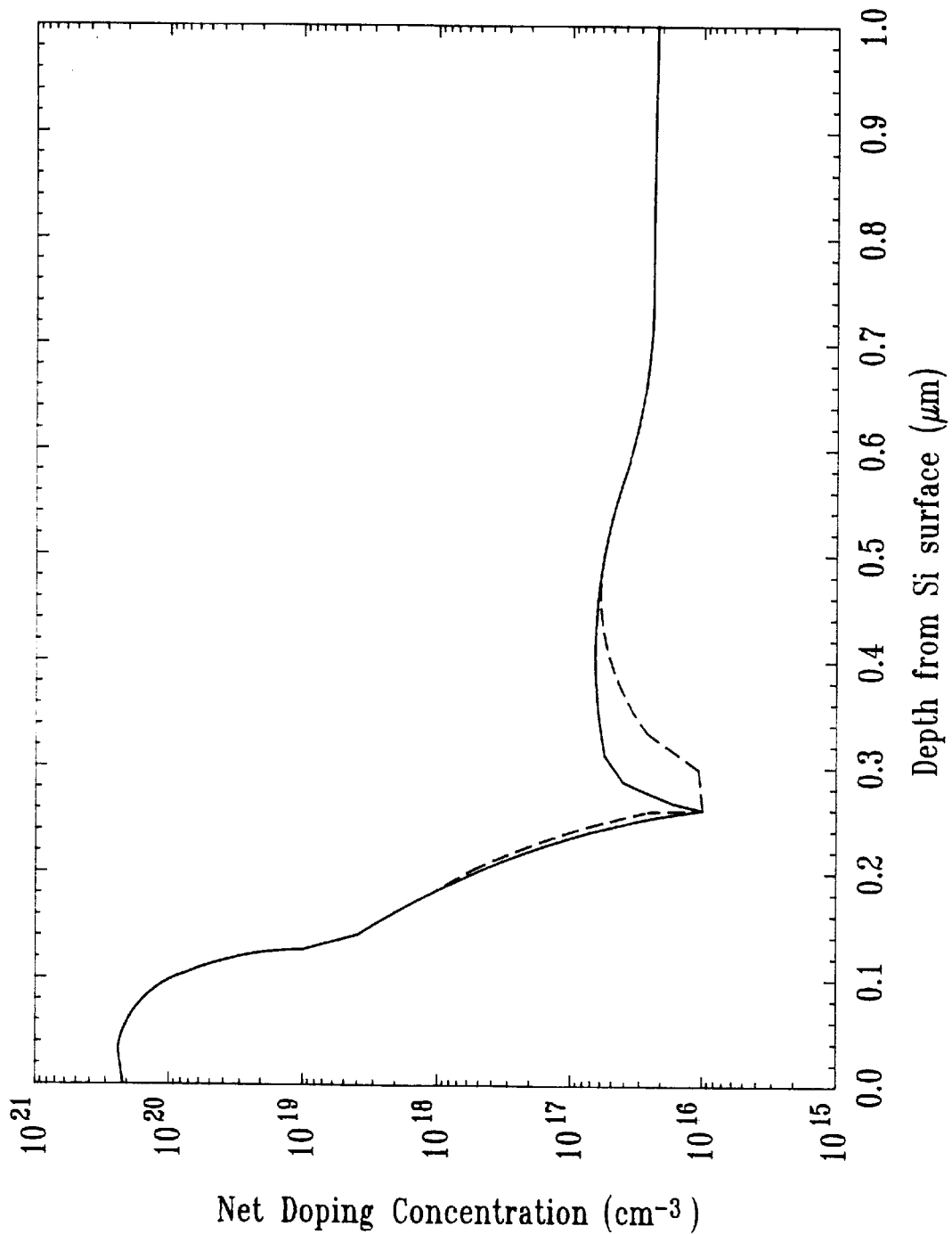
FIG. 10 demonstrates two simulating doping profiles of the source/drain region of NMOSFETs.

Referring to FIG. 10, two simulated doping profiles of the source/drain and channel region of NMOSFET are shown. There are two graphics in these two drawing. The energy and the dosage of the implantation stages for the two doping profiles are listed in TABLE 1.

TABLE 1

| Profile/Stage | 1 | 2 | 3 | 4 | Theshold Voltage (V) |
|---|---|---|---|---|---|
| Solid Line | No | 150 KeV, $1.0 \times 10^{12}$ ions/cm$^2$ | 80 KeV, $3.8 \times 10^{12}$ ions/cm$^2$ | No | 0.733 |
| Dash Line | No | 150 KeV, $1.0 \times 10^{12}$ ions/cm$^2$ | 80 KeV, $4 \times 10^{12}$ ions/cm$^2$ | 150 KeV, $8 \times 10^{11}$ ions/cm$^2$ | 0.732 |

Figure 11:
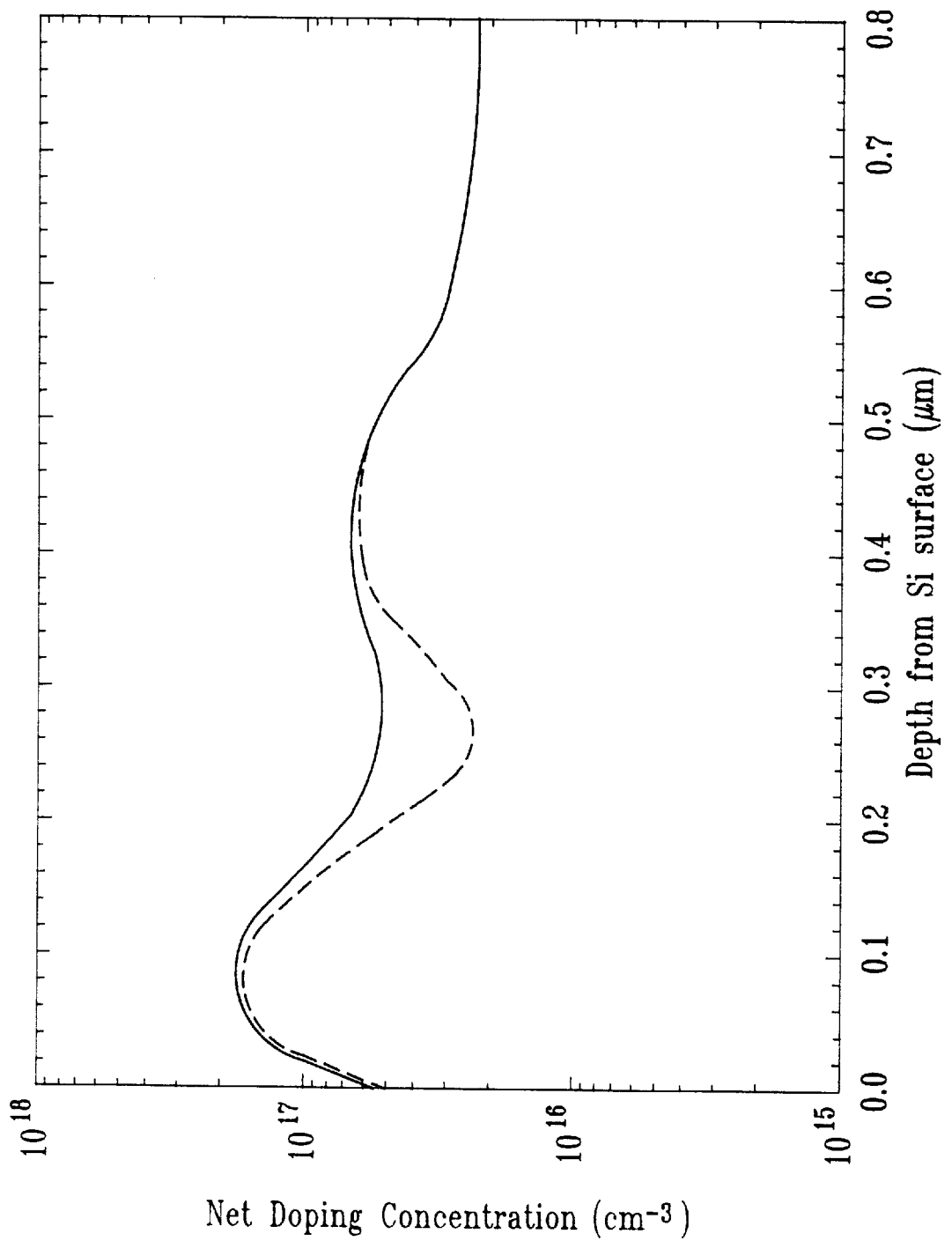
FIG. 11 demonstrates two simulating doping profiles of the channel region of NMOSFETs.

Referring to FIG. 11, two simulating doping profiles of the channel of NMOSFET are demonstrated. The solid-line graphic is a doping profile of the channel of NMOS in accordance with the prior art and the dash-line graphic is a doping profile of the channel of NMOS in accordance with the present invention. The energy and the dosage of the implantation stages for the doping profiles are shown in TABLE 1.

Figure 12:
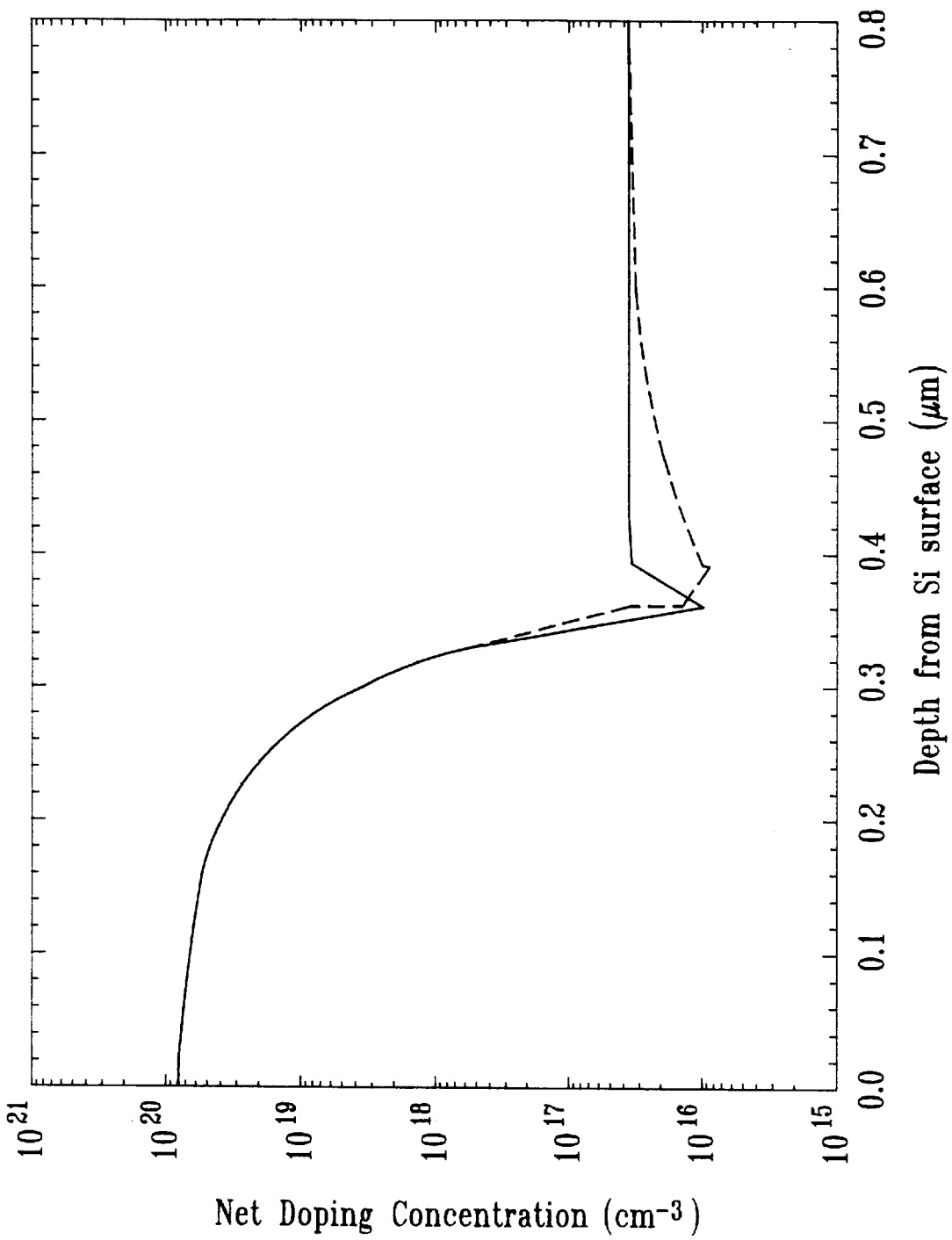
FIG. 12 demonstrates two simulating doping profiles of the source/drain region of PMOSFETs.

Referring to FIG. 12, there are two simulated profiles of source/drain of PMOSFET in the drawing. The solid-line graphic is a doping profile of the source/drain of PMOS in accordance with prior art and the dash-line graphic is a doping profile of the source/drain of PMOS in the present invention. The energy and the dosage of the implantation stages for the doping profiles are illustrated in TABLE 2.

TABLE 2

| Profile/Stage | 1 | 2 | 3 | 4 | Threshold Voltage (V) |
|---|---|---|---|---|---|
| Solid Line | 120 KeV, $2.4 \times 10^{12}$ ions/cm$^2$ | No | 80 KeV, $3.8 \times 10^{12}$ ions/cm$^2$ | No | 0.917 |
| Dash Line | 120 KeV, $2.2 \times 10^{12}$ ions/cm$^2$ | 150 KeV, $1.0 \times 10^{12}$ ions/cm$^2$ | 80 KeV, $4 \times 10^{12}$ ions/cm$^2$ | 150 KeV, $8 \times 10^{11}$ ions/cm$^2$ | 0.914 |

Figure 13:
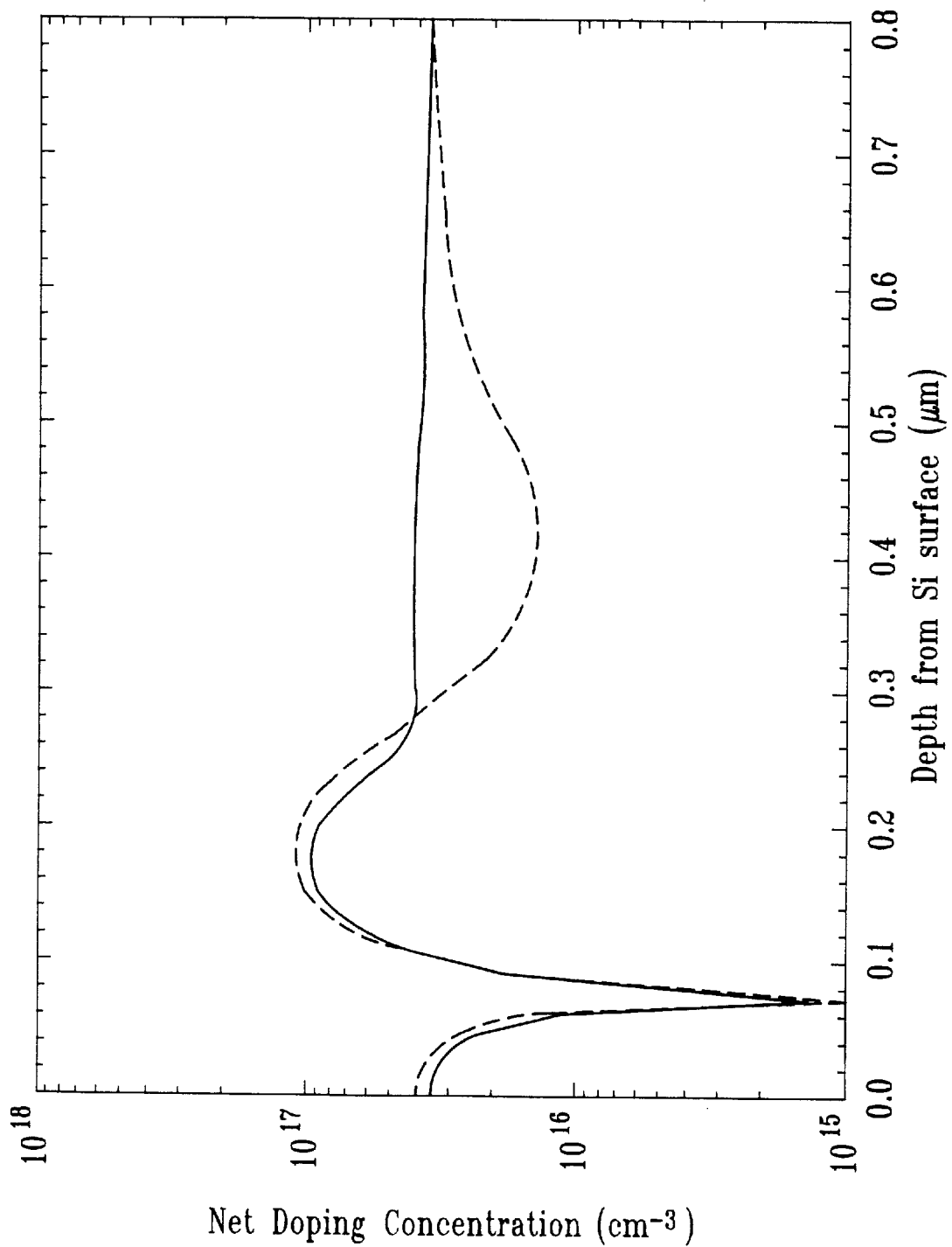
FIG. 13 demonstrates two simulating doping profiles of the channel region of PMOSFETs.

Referring to FIG. 13, two simulated doping profiles of the channel of PMOSFET devices are demonstrated in the drawing. The solid-line graphic is a doping profile of PMOS of the prior art and the dash-line graphic is a doping profile of PMOS of the present invention. The energy and the dosage of the implantation stages for the doping profiles are explained in TABLE 2.

As is illustrated in FIGS. 10 to 13, it is seen that the impurity of the field oxide isolation and P-well counter doping implanted samples were reduced not only in the channel but also under source/drain region. These results are similar to the report of the references that are mentioned in the background of the present invention. The junction capacitance of the blanket well counter doping samples was lower than the conventional samples.

The benefits of this invention are (1) the junction capacitance of MOSFETs could be reduced for high speed circuits applications; (2) the proposed recipe is easy for manufacturing without additional mask; (3) the processing cost and the turn-around-time (TAT) time could be reduced; and (4) the gate oxide reliability is better than that of the references that are described above.

While the preferred embodiment of the invention has been illustrated and described, it will be appreciated that various changes can be made therein without departing from the spirit and scope of the invention.

What is claimed is:

1. A method to manufacture a complementary metal oxide semiconductor device, the method comprising the steps of:
   providing a substrate having a P-well region and an N-well region;
   forming a pad oxide layer on said substrate;
   forming a silicon nitride pattern on said pad oxide layer to define active regions of said P-well region and an N-well region;
   forming a field oxide region on said substrate;
   removing said silicon nitride pattern;
   performing a first ion implantation with N-type conducting dopants on said N-well region to form an anti-punchthrough region in said N-well region;
   performing a second ion implantation with P-type conducting dopants on said substrate for a counter doping region of said N-well region and a doping region of said P-well region;
   performing a third ion implantation with P-type conducting dopants on said substrate to adjust a threshold voltage of said N-well and said P-well;
   performing a fourth ion implantation with N-type conducting dopants on said substrate for a counter doping region of said P-well and a doping region of said N-well region;
   removing said pad oxide layer;
   forming gate structures on said P-well region and said N-well region; and
   forming source/drain regions in said P-well region and said N-well region to form a NMOS device on said P-well region and a PMOS device on said N-well region.

2. The method of claim 1, wherein the dopants of said first ion implantation comprised Arsenic ion.

3. The method of claim 1, wherein the dopants of said first ion implantation comprised Phosphorus ions.

4. The method of claim 1, wherein said first ion implantation has an implanting energy between about 80 to 200 KeV and a dosage between about $1 \times 10^{12}$ to $2 \times 10^{13}$ ions/cm$^2$.

5. The method of claim 1, wherein the dopants of said second ion implantation comprises boron ions.

6. The method of claim 1, wherein said second ion implantation has an implanting energy between about 100 to 250 KeV and a dosage between about $5 \times 10^{11}$ to $5 \times 10^{12}$ ion/cm$^2$.

7. The method of claim 1, wherein the dopants of said third ion implantation comprises BF$_2$ ions.

8. The method of claim 1, wherein said third ion implantation has an implanting energy between about 30 to 120 KeV and a dosage between about $2 \times 10^{12}$ to $4 \times 10^{13}$ ion/cm$^2$.

9. The method of claim 1, wherein the dopants of said fourth ion implantation comprises Phosphorus ions.

10. The method of claim 1, wherein said fourth ion implantation has an implanting energy between about 80 to 250 KeV and a dosage between about $4 \times 10^{11}$ to $4 \times 10^{12}$ ion/cm$^2$.

11. A method to manufacture a complementary metal oxide semiconductor device, the method comprising the steps of:

provdiing a substrate having a first well region and a second well region;

forming a pad oxide layer on said substrate;

forming a silicon nitride pattern on said pad oxide layer to define active regions of said first well region and said second well region;

forming a field oxide region on said substrate;

removing said silicon nitride pattern;

performing a first ion implantation with first type conducting dopants on said first well region to form an anti-punchthrough region in said first well region;

performing a second ion implantation with second type conducting dopants on said substrate for a counter doping region of said first well region and a doping region of said second well region;

performing a third ion implantation with second type conducting dopants on said substrate to adjust a threshold voltage of said first well region and said second well region;

performing fourth ion implantation with first type conducting dopants on said substrate for a counter doping region of said second well and a doping region of said first well region;

removing said pad oxide layer;

forming a gate structures on said second well region and said first well region; and forming source/drain regions in said second well region and said first well region to form devices on said second well region and on said first well region.

12. The method of claim 11, wherein the polarity of said first well region is opposite to the polarity of said second well region.

13. The method of claim 12, wherein the polarity of said first conducting dopants is opposite to the polarity of said second conducting dopants.

14. The method of claim 11, wherein said first ion implantation has an implanting energy between about 80 to 200 KeV and a dosage between about $1 \times 10^{12}$ to $2 \times 10^{13}$ ions/cm$^2$.

15. The method of claim 11, wherein said second ion implantation has an implanting energy between about 100 to 250 KeV and a dosage between about $5 \times 10^{11}$ to $5 \times 10^{12}$ ion/cm$^2$.

16. The method of claim 11, wherein said third ion implantation has an implanting energy between about 30 to 120 KeV and a dosage between about $2 \times 10^{12}$ to $4 \times 10^{13}$ ion/cm$^2$.

17. The method of claim 11, wherein said fourth ion implantation has an implanting energy between about 80 to 250 KeV and a dosage between about $4 \times 10^{11}$ to $4 \times 10^{12}$ ion/cm$^2$.

* * * * *